United States Patent
Zhang et al.

(10) Patent No.: US 11,721,743 B2
(45) Date of Patent: Aug. 8, 2023

(54) IMPLANTATION ENABLED PRECISELY CONTROLLED SOURCE AND DRAIN ETCH DEPTH

(71) Applicant: Applied Materials, Inc., Santa Clara, CA (US)

(72) Inventors: Qintao Zhang, Gloucester, MA (US); Wei Zou, Gloucester, MA (US); Samphy Hong, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 192 days.

(21) Appl. No.: 17/130,605

(22) Filed: Dec. 22, 2020

(65) Prior Publication Data
US 2022/0199802 A1    Jun. 23, 2022

(51) Int. Cl.
*H01L 29/66* (2006.01)
*H01L 21/67* (2006.01)
*H01L 29/778* (2006.01)

(52) U.S. Cl.
CPC .. *H01L 29/66462* (2013.01); *H01L 21/67069* (2013.01); *H01L 21/67075* (2013.01); *H01L 29/66431* (2013.01); *H01L 29/66636* (2013.01); *H01L 29/778* (2013.01)

(58) Field of Classification Search
CPC ......... H01L 29/66462; H01L 21/67069; H01L 21/67075; H01L 29/66431; H01L 29/66636; H01L 29/778; H01L 21/2654; H01L 22/12; H01L 21/30617; H01L 21/30621; H01L 29/2003; H01L 29/41766; H01L 29/7786
See application file for complete search history.

(56) References Cited

U.S. PATENT DOCUMENTS

| 8,937,338 B2 * | 1/2015 | Chowdhury | H01L 29/66204 257/194 |
| 11,476,359 B2 * | 10/2022 | Guo | H01L 29/32 |
| 2002/0096496 A1 | 7/2002 | Molnar et al. | |

(Continued)

FOREIGN PATENT DOCUMENTS

| CA | 2634068 A1 * | 7/2007 | ........... H01L 29/401 |
| CA | 3093906 A1 * | 11/2020 | ......... H01L 29/1066 |

(Continued)

OTHER PUBLICATIONS

Constant et al., "Recessing Process for Au-free Ohmic Contacts Formation on AlGaN/GaN Heterostructures with AlN Spacer", ON Semiconductor, CS ManTech Conference, 2017.

(Continued)

*Primary Examiner* — Mohammed Shamsuzzaman
(74) *Attorney, Agent, or Firm* — Nields, Lemack & Frame, LLC

(57) ABSTRACT

A method of fabricating a high electron mobility transistor is disclosed. The method comprises using an ion implantation process to amorphize a portion of the barrier layer to a specific depth. The etch rate of this amorphized portion is much faster than that of the rest of the barrier layer. In this way, the depth of the recessed regions into which the source and drain contacts are disposed is more tightly controlled. Further, the etching process may be a wet or dry etch process. The roughness of the recessed region may also be improved using this approach.

14 Claims, 7 Drawing Sheets

(56) References Cited

U.S. PATENT DOCUMENTS

| | | | | |
|---|---|---|---|---|
| 2007/0269968 | A1* | 11/2007 | Saxler | H01L 29/66462 |
| | | | | 438/522 |
| 2009/0042344 | A1* | 2/2009 | Ye | H01L 21/02301 |
| | | | | 257/E21.409 |
| 2012/0061681 | A1* | 3/2012 | Thei | H01L 27/0617 |
| | | | | 257/77 |
| 2014/0131720 | A1* | 5/2014 | Hsiung | H01L 21/0254 |
| | | | | 438/285 |
| 2015/0021662 | A1* | 1/2015 | Basu | H01L 29/7784 |
| | | | | 438/285 |
| 2015/0255291 | A1* | 9/2015 | Cha | H01L 29/0847 |
| | | | | 438/299 |
| 2016/0351564 | A1* | 12/2016 | Azize | H01L 29/66621 |
| 2017/0373179 | A1* | 12/2017 | Sriram | H01L 29/7786 |
| 2021/0013334 | A1* | 1/2021 | Huang | H01L 29/207 |
| 2021/0028020 | A1* | 1/2021 | Anderson | H01L 29/452 |

FOREIGN PATENT DOCUMENTS

| | | | | |
|---|---|---|---|---|
| CN | 101465372 A | * | 6/2009 | H01L 21/8252 |
| CN | 102683406 A | * | 9/2012 | H01L 29/66462 |
| CN | 106229345 A | * | 12/2016 | H01L 21/8252 |
| CN | 107154427 A | * | 9/2017 | H01L 29/0603 |
| CN | 108376735 A | * | 8/2018 | H01L 29/0607 |
| CN | 108649071 A | * | 10/2018 | H01L 21/26546 |
| CN | 108987474 A | * | 12/2018 | H01L 29/0607 |
| CN | 111081763 A | * | 4/2020 | H01L 29/0607 |
| FR | 2865851 A1 | * | 8/2005 | H01L 21/82345 |
| JP | 2022024947 A | * | 2/2022 | H01L 21/02389 |
| WO | WO-2017027704 A1 | * | 2/2017 | H01L 21/8252 |

OTHER PUBLICATIONS

Gao et al., "Enhanced Wet Etching of Patterned GaN with Heavy-Ion Implantation", IEEE, 3rd International Nanoelectronics Conference, pp. 505-506, Jan. 2010.

Schiestel et al., "Patterning of GaN by ion implantation-dependent etching", Materials Science and Engineering B, vol. 82, pp. 111-113, May 2001.

* cited by examiner

IMPLANTATION ENABLED PRECISELY CONTROLLED SOURCE AND DRAIN ETCH DEPTH

FIELD

Embodiments of this disclosure are directed to methods for creating high electron mobility transistors, and more particularly for creating precisely controlled etch depths for source and drain contacts to improve contact resistance and uniformity.

BACKGROUND

High electron mobility transistors (HEMTs) operate based on a difference in band gap between two adjacent layers. In the interface between these two adjacent layers, a two-dimensional electron gas (2DEG) is created.

A source contact and a drain contact are disposed on either side of a gate contact. In operation, current flows between the source and the drain, depending on the voltage applied to the gate. This is ideally a very low resistance path. However, there are several contributors to the resistance between the source contact and the drain contact. For example, in certain embodiments, there may be three major contributors to the overall resistance. The first is the 2DEG tunneling resistance. The second is the bulk resistance through the barrier layer, which may be a AlGaN material. The third is the contact resistance between the source and drain contacts and the barrier layer.

One approach to reduce the overall resistance is to recess the source and drain contacts into the barrier layer, which may serve to reduce the bulk resistance through the barrier layer.

However, creating the recessed region in the barrier layer is not trivial. First, there is no etch stop layer, so it may difficult to determine when to terminate the etch process. Second, time dependent etching may lead to depth non-uniformity. For example, the width of the contact influences the etch rate. Thus, the etch time to achieve a certain depth for one contact may not be appropriate for a second contact having a different width.

Therefore, it would be beneficial if there were a method of fabricating a HEMT that lowered the overall resistance of the device. Further, it would be advantageous if this method were repeatable in that the desired etch depth was consistently achieved. Further, it would be helpful if the roughness of this etched recessed region was reduced.

SUMMARY

A method of fabricating a high electron mobility transistor is disclosed. The method comprises using an ion implantation process to amorphize a portion of the barrier layer up to a specific depth. The etch rate of this amorphized portion is much faster than that of the rest of the barrier layer. In this way, the depth of the recessed region into which the source and drain contacts are disposed is more tightly controlled. Further, the etching process may be a wet or dry etch process. The roughness of the recessed region may also be improved using this approach.

According to one embodiment, a method of fabricating a high electron mobility transistor is disclosed. The method comprises applying a patterned photoresist mask on top of a workpiece, wherein the workpiece comprises a substrate, a buffer layer disposed above the substrate, a channel layer disposed above the buffer layer, a barrier layer disposed above the channel layer, and a passivation layer disposed above the barrier layer, and wherein exposed portions of the passivation layer are not covered by the patterned photoresist mask; performing a first etch process to etch exposed portions of the passivation layer until the barrier layer is reached; implanting ions into exposed portions of the barrier layer to create amorphized implanted regions of the barrier layer; performing a second etch process to etch the amorphized implanted regions to form recessed regions; and forming a source contact and a drain contact in the recessed regions. In certain embodiments, the ions comprise molecules comprising a Group 4 or inert element. In certain further embodiments, the ions comprise an inert element. In some embodiments, the patterned photoresist mask serves as a mask for two etch processes and an implant process. In certain embodiments, the barrier layer comprises a III-V semiconductor. In some embodiments, the second etch process is performed using a wet etch process. In some embodiments, the second etch process is performed using a dry etch process. In certain embodiments, the implanting is performed at a temperature less than −50° C. In some embodiments, the implanting is performed using a plurality of implant energies. In certain embodiments, a cap layer is disposed between the barrier layer and the passivation layer, and the cap layer is etched by the first etch process. In some embodiments, the method further comprises forming a gate structure, wherein the gate structure is disposed on the passivation layer or in a recessed portion of the passivation layer. In certain embodiments, the recessed regions do not extend through an entirety of the barrier layer.

According to another embodiment, a high electron mobility transistor fabricated using the method described above is disclosed.

According to another embodiment, a method of forming a recessed region in a barrier layer of a workpiece, wherein the workpiece comprises a substrate, a buffer layer disposed above the substrate, a channel layer disposed above the buffer layer, and the barrier layer disposed above the channel layer, is disclosed. The method comprises implanting ions into the barrier layer to create an amorphized implanted region of the barrier layer; and etching the amorphized implanted region to form the recessed region. In certain embodiments, the ions comprise molecules comprising a Group 4 or inert element. In certain embodiments, the implanting is performed at a temperature less than −50° C. In some embodiments, the etching of the amorphized implanted region is performed using a wet etch process. In some embodiments, the etching of the amorphized implanted region is performed using a dry etch process. In certain embodiments, the roughness of the recessed region is less than 1 nm. In some embodiments, the implanting is performed using a plurality of implant energies.

BRIEF DESCRIPTION OF THE FIGURES

For a better understanding of the present disclosure, reference is made to the accompanying drawings, which are incorporated herein by reference and in which.

DETAILED DESCRIPTION

The present disclosure describes a method of creating recessed regions in a barrier layer. In certain embodiments, the source contact and the drain contact may be disposed in these recessed regions to form a HEMT device.

Figure 1:
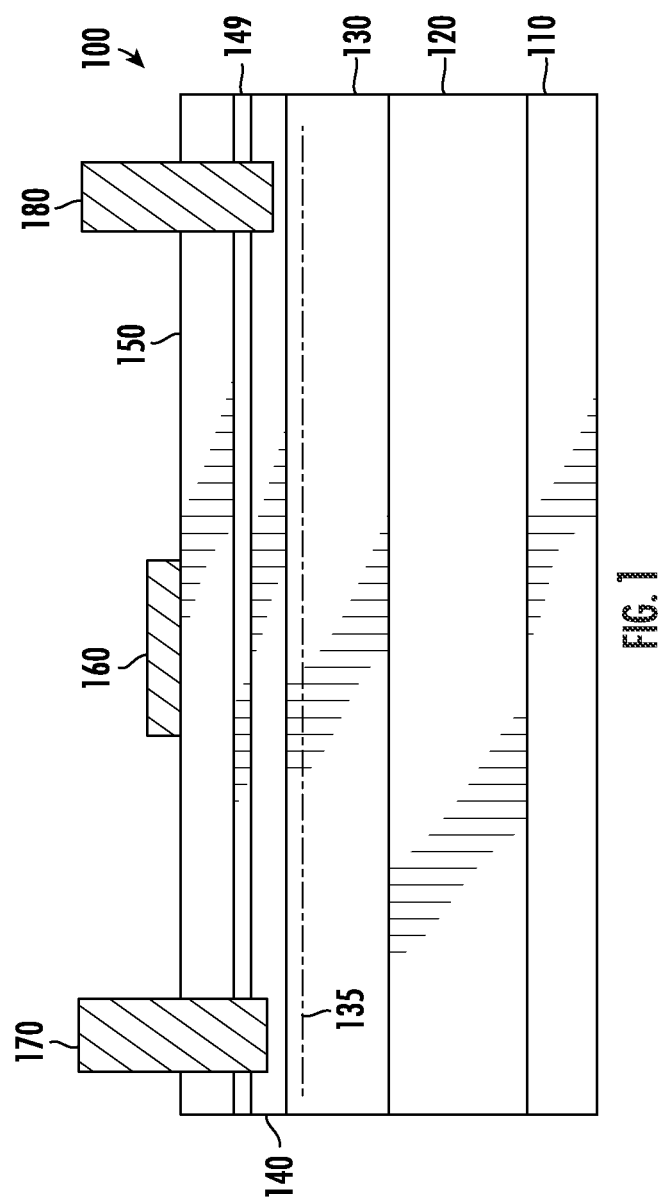
FIG. 1 shows a cross section of a HEMT with the source and drain contacts disposed in the etched recessed regions according to one embodiment.

FIG. 1 shows a high electron mobility transistor 100 according to one embodiment. The HEMT 100 includes a buffer layer 120. The buffer layer 120 may be formed on a substrate 110, wherein the substrate 110 is suitable for semiconductor epitaxial growth. The substrate 110 may include a group IV semiconductor material such as silicon, for example. Other typical substrates include SiC, Sapphire, Si, and bulk GaN.

The buffer layer 120 is formed over the substrate 110 and may have multiple sub-layers or a gradient. The thickness of the buffer layer 120 may be about 3500 nm, although other thickness may also be used. In certain embodiments, one or more lattice match layers may be disposed between the substrate 110 and the buffer layer 120.

A channel layer 130 is formed over the buffer layer 120. The buffer layer 120 may comprise a III-V semiconductor such as GaN.

A barrier layer 140 is disposed over the channel layer 130. The barrier layer 140 may be made of III-V semiconductors selected from the group consisting of AlGaN, InAlN, AlN and InAlGaN. Because of their different composition, the barrier layer 140 and the channel layer 130 have different band gaps. Consequently, a two-dimensional electron gas 135 exists in the channel layer 130 near the interface with the barrier layer 140.

In certain embodiments, a cap layer 149 may be disposed on the barrier layer 140. The cap layer 149 may be GaN or another material. In other embodiments, the cap layer 149 may not be present.

A passivation layer 150 is then disposed above the barrier layer 140. In certain embodiments, the passivation layer 150 is disposed directly on the barrier layer 140. In other embodiments, a cap layer 149 may be disposed between the barrier layer 140 and the passivation layer 150. The passivation layer 150 may be a dielectric material, such as silicon nitride, $SiO_2$, $SiO_xN_y$, $Al_2O_3$, GaN, AlN, or combination of these materials. In certain embodiments, there may be a plurality of films that form the passivation layer 150. For example, there may be an AlN film disposed on the cap layer 149 (or the barrier layer 140). An $Al_2O_3$ film may be disposed on the AlN film and a silicon nitride layer may be disposed on the $Al_2O_3$ film. This plurality of films comprises the passivation layer 150. In other words, the passivation layer 150 may be a single film or may be a plurality of different films.

In certain embodiments, a gate structure 160 may be disposed on the passivation layer 150. A source contact 170 may be disposed in a recessed region created through the passivation layer 150, the cap layer 149 (if present) and at least part of the barrier layer 140. Similarly, a drain contact 180 may be disposed in a recessed region created through the passivation layer 150, the cap layer 149 (if present) and at least part of the barrier layer 140.

The gate structure 160 is disposed between the source contact 170 and the drain contact 180.

The gate structure 160, the source contact 170 and the drain contact 180 may be a metal, such as Ti, Al, TiN, W, WN, Ni, Au, or Pt, or any other suitable conductive material.

The two-dimensional electron gas 135 may be used to conduct electrical current between the source contact 170 and the drain contact 180. The voltage applied to the gate structure 160 controls the flow of electrons in the two-dimensional electron gas from the source contact 170 to the drain contact 180.

To minimize the contact resistance between the source contact 170 and the drain contact 180, it may be beneficial to reduce the 2DEG tunneling resistance and the bulk resistance of the barrier layer 140. The depth of the recessed regions in which the source contact 170 and the drain contact 180 are disposed may influence to overall contact resistance. For example, in one example HEMT, the contact resistance may be in excess of 1.5 ohm-mm if the source contact 170 and the drain contact 180 are disposed on top of the barrier layer 140. Removal of 50% of the barrier layer 140 may reduce the contact resistance to about 0.7 ohm-mm. Removal of 75% of the barrier layer 140 may reduce the contact resistance to less than 0.5 ohm-mm. However, removal of all of the barrier layer 140 may create a contact resistance in excess of 1.2 ohm-mm. Thus, removal of most, but not all, of the barrier layer 140 may be beneficial to reducing contact resistance and improving performance.

However, there is no etch stop layer in the barrier layer 140. Thus, a different method for etching the barrier layer 140 is desired.

FIGS. 2A-2H show the sequence of fabrication processes that may be performed to create the recessed regions that may be used for the source contact 170 and the drain contact. FIG. 3 is a flowchart showing the processes illustrated in FIGS. 2A-2H.

Figure 2A:
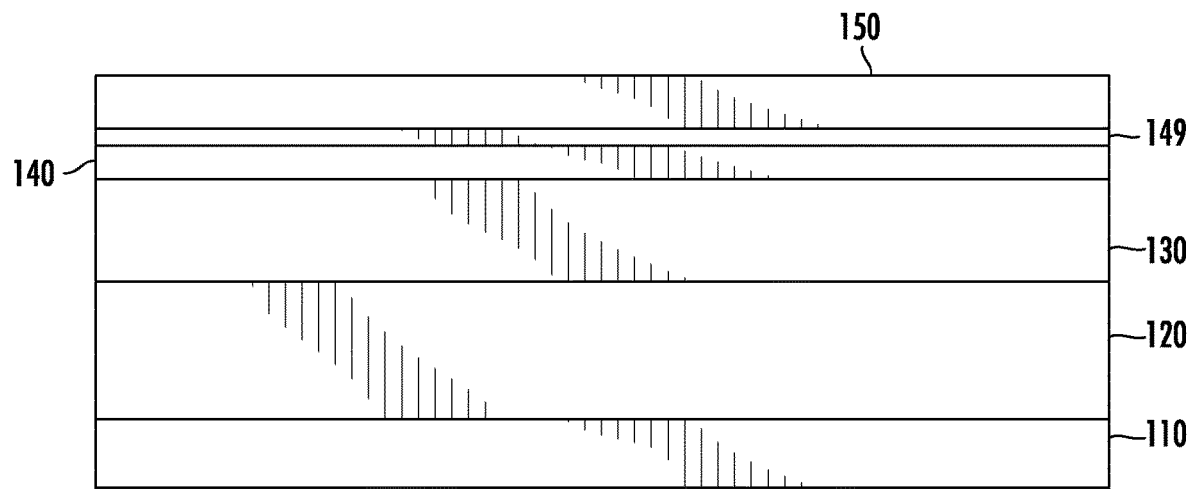
FIGS. 2A-2H show a sequence of processes to form a HEMT according to one embodiment.
Figure 3:
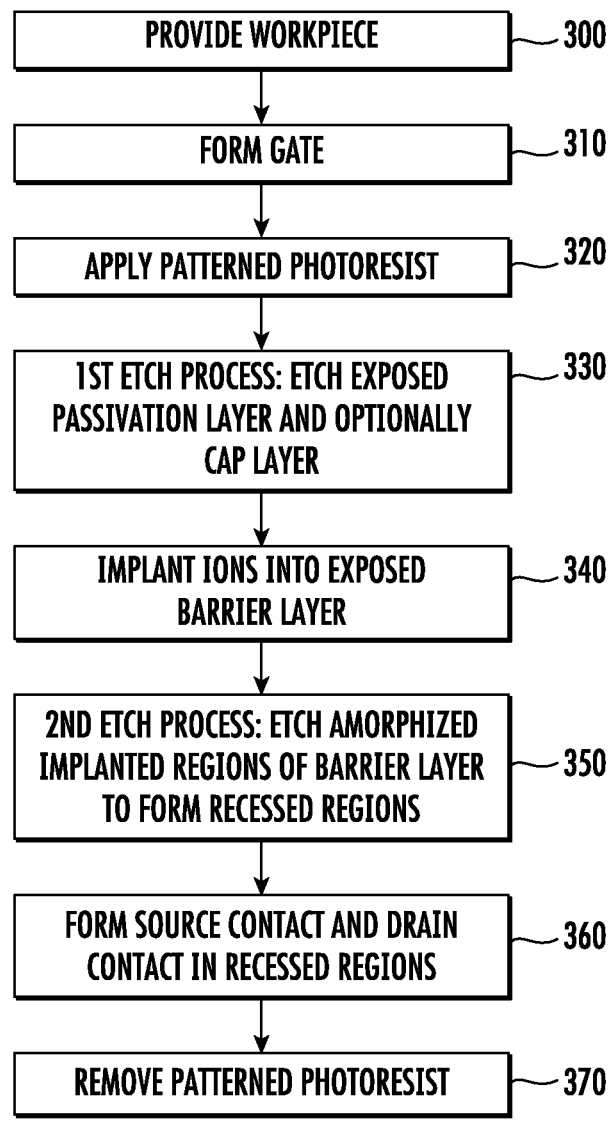
FIG. 3 is a flowchart showing the fabrication of a HEMT according to the embodiment shown in FIGS. 2A-2H.

FIG. 2A shows the workpiece prior to the creation of the gate structure 160, the source contact 170 and the drain contact 180. The buffer layer 120 may be formed on the substrate 110 via epitaxial growth. As noted above, the buffer layer 120 may be one or more different materials. Similarly, the channel layer 130 may be formed on the buffer layer 120 via epitaxial growth. Additionally, the barrier layer 140 may be formed on the channel layer 130 via epitaxial growth. The cap layer 149 may optionally be formed on the barrier layer 140. The passivation layer 150 may be formed on the barrier layer 140 or the cap layer 149, if present, using chemical vapor deposition (CVD), or more specifically, low pressure chemical vapor deposition (LPCVD). Alternatively, the passivation layer 150 may be formed by plasma-enhanced chemical vapor deposition (PECVD), physical vapor deposition or another method. Of course, other methods may be used to form the layers of the HEMT. Furthermore, each layer may be made up of more than one material. For example, as described above, the passivation layer 150 may comprise a plurality of different films.

Thus, as shown in Box 300, a workpiece is provided, wherein the workpiece comprises a substrate 110, a buffer layer 120 disposed above the substrate 110, a channel layer 130 disposed above the buffer layer 120, a barrier layer 140 disposed above the channel layer 130 and a passivation layer 150 disposed above the barrier layer 140. In certain embodiments, a cap layer 149 may be disposed between the barrier layer 140 and the passivation layer 150. However, in these embodiments, the passivation layer 150 is still disposed above the barrier layer 140.

Figure 2B:
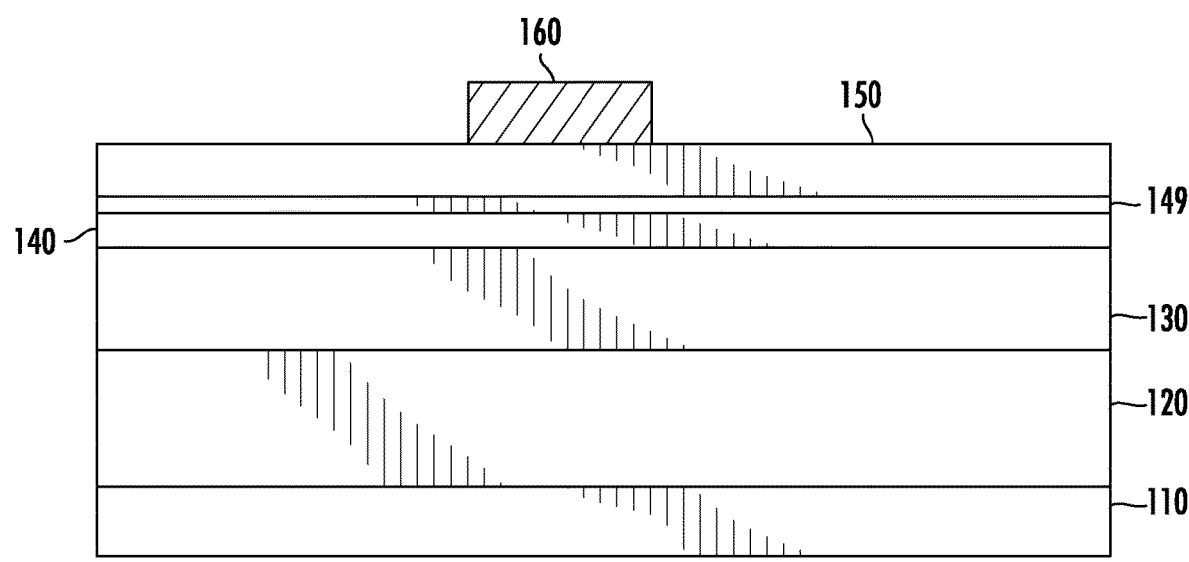

Next, as shown in FIG. 2B and Box 310 of FIG. 3, a gate structure 160 is formed on the passivation layer 150. In certain embodiments, the gate structure 160 may comprise a metal, such as Ti, Al, TiN, W, WN, Ni, Au, or Pt, poly-silicon and any other suitable conductive material. To form the gate structure 160, a set of layers may be disposed on the top surface of the passivation layer 150 or recessed passivation layer and the material used for the gate structure 160 may be deposited. A lithography process is used to pattern the gate to form the shape of gate structure 160.

Figure 2C:
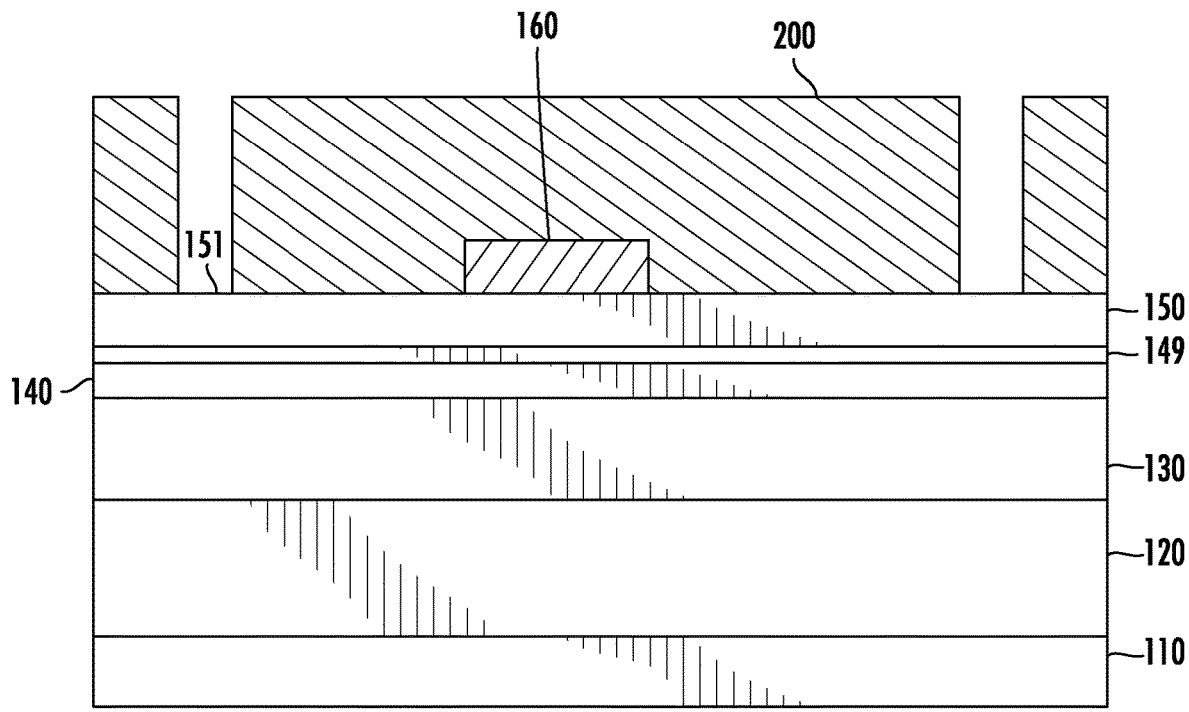

A patterned photoresist 200 may then be applied on top of the gate structure 160 and the passivation layer 150, as shown in FIG. 2C and Box 320 of FIG. 3. The openings in the patterned photoresist 200 correspond to the locations where the recessed regions are to be formed for the source contact 170 and the drain contact 180. Thus, after the patterned photoresist 200 is applied, there are exposed portions 151 of the passivation layer 150.

Figure 2D:
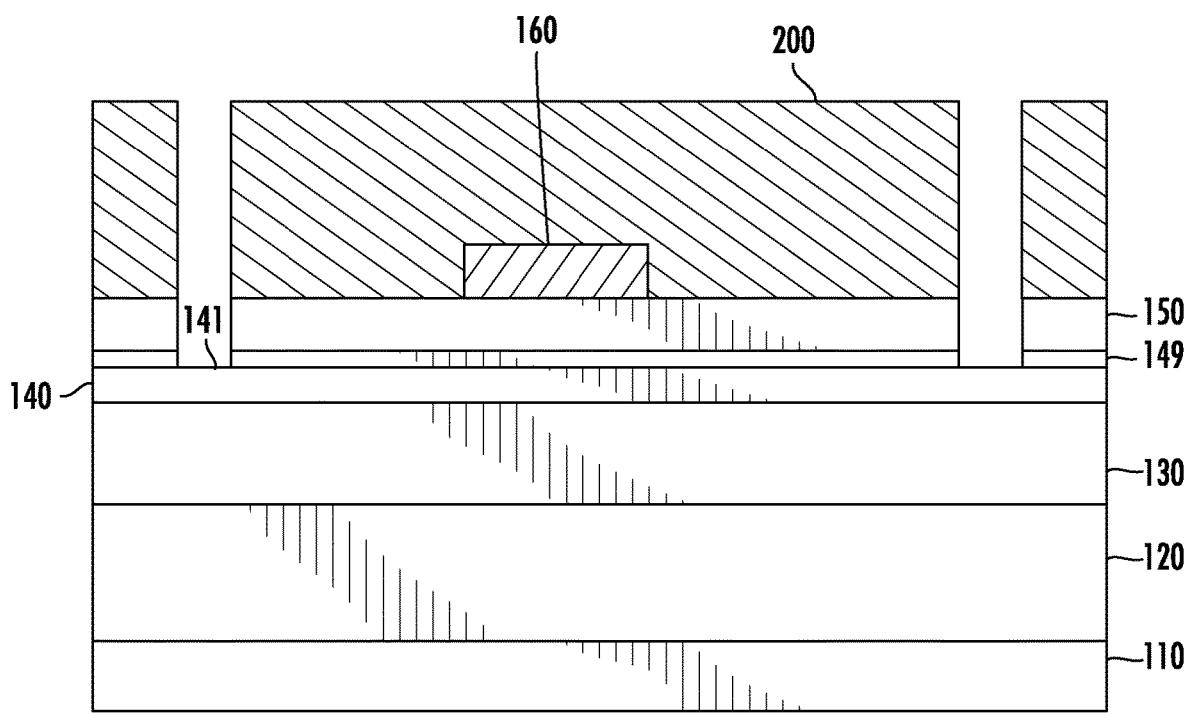

As shown in FIG. 2D and Box 330 of FIG. 3, a first etch process is performed to remove the exposed portions 151 of the passivation layer 150. In certain embodiments, a dry etch is performed to remove the exposed portions 151 of the passivation layer 150. For example, in one embodiment, an etching species, such as $CF_4$, $O_2$, $N_2$, or $NF_3$, may be used to etch the passivation layer 150. In other embodiments, a wet etch process may be used. For example, a hydroxide, such as potassium hydroxide or orthophosphoric acid, may be used. In certain embodiments, the barrier layer 140 may serve as an etch stop for this etching process. Thus, in certain embodiments, the entire thickness of the exposed portions 151 of the passivation layer 150 is removed. In embodiments that include a cap layer 149, the entire thickness of the cap layer 149 may also be etched during this first etch process.

After this first etch process, there are exposed portions 141 of the barrier layer 140, as shown in FIG. 2D.

Figure 2E:
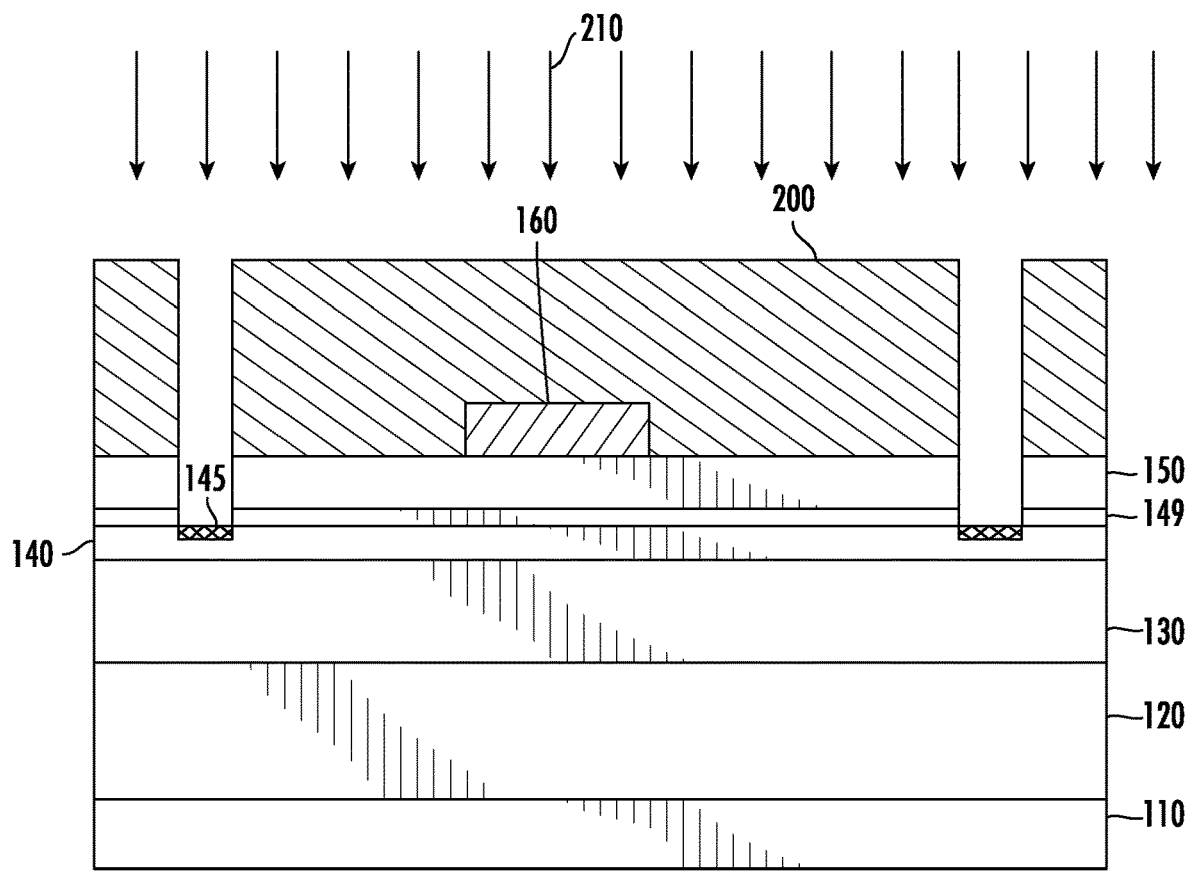

Next, as shown in FIG. 2E and Box 340 of FIG. 3, an implant process is performed. In certain embodiments, the ions 210 may be a molecular or atomic species comprising a Group 4 element or an inert element. In certain embodiment, a heavier element may be utilized, such as silicon, germanium, argon, krypton or xenon. In certain embodiments, a single implant is performed at a predetermined implant energy and dose. In one particular example, an implant of xenon may be performed at an energy of 10 KeV and 25 KeV, where the dose may be between 1E14 and 1E17.

Generally, higher doses typically create a more amorphized implanted region 145, which may be more easily etched. In other words, higher doses typically increase the etch selectivity. As stated above, the dose may be between 1E14 and 1E17.

Higher implant energies typically result in deeper amorphized implanted regions 145. In certain embodiments, the implant energy may be between 6 KeV and 50 KeV. In some embodiments, the implant energy may be between 10 KeV and 25 KeV. The implant energy may be a function of the thickness of the barrier layer 140 and the percentage of the thickness of the barrier layer 140 that is to be amorphized. Thus, the combination of implant energy and dose may be tuned to achieve an amorphized implanted region 145 in the barrier layer 140 having a desired depth. Further, if desired, multiple implants may be performed at different implant energies and optionally different doses to create a concentration box profile.

Further, in certain embodiments, the implant process or processes may be performed at room temperature. In other embodiments, the implant process or processes may be performed at cold temperatures, such as less than 0° C. In some embodiments, the implant process or processes may be performed at temperatures that are less than −50° C. In certain embodiments, the implant process or processes may be performed at −100° C. Cold implants typically foster more amorphization to the crystalline structure.

The implant process or processes may be tuned so as to implant ions 210 at least as deep as 50% of the thickness of the barrier layer 140. Of course, in some embodiments, less than 50% of the thickness of the barrier layer 140, such as 25%, may be implanted. In certain embodiments, the ions 210 may be implanted as deep as 75% of the thickness of the barrier layer 140. In some embodiments, the implant energy or energies are selected so that the ions 210 do not penetrate through the barrier layer 140. For example, up to 90% of the thickness of the barrier layer 140 may be etched. In other words, in certain embodiments, the amorphized implanted regions 145 does not comprise the entirety of the thickness of the barrier layer 140.

Figure 2F:
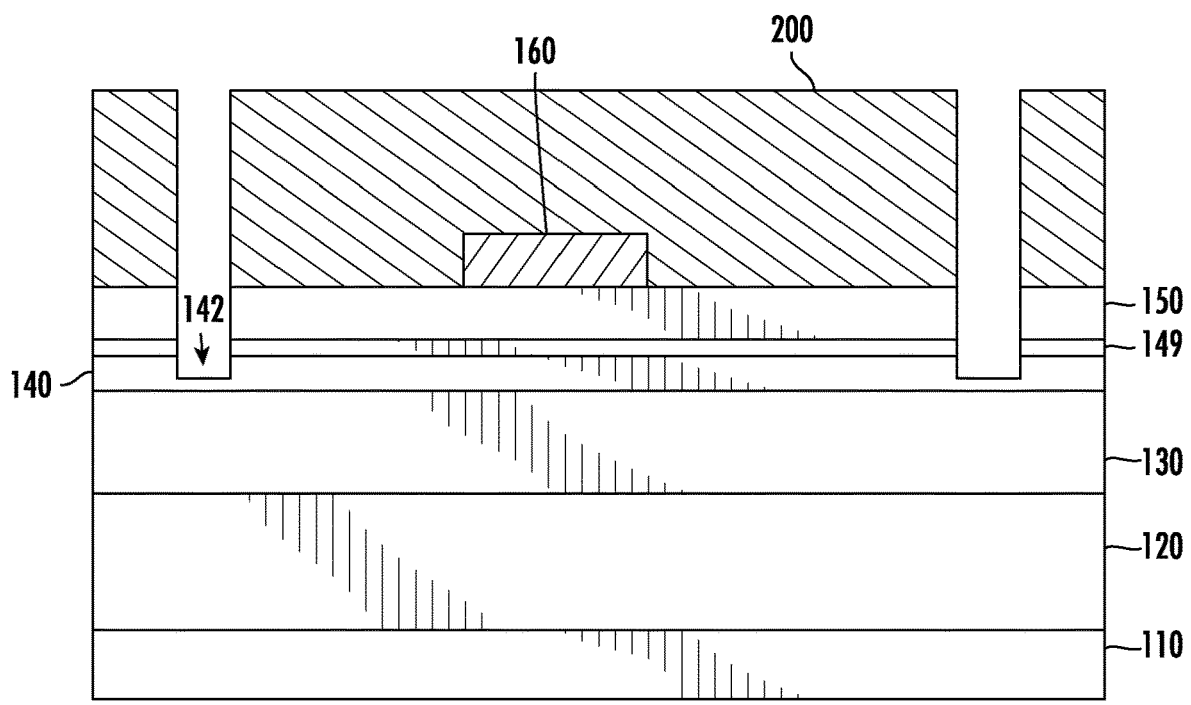

Next, as shown in FIG. 2F and Box 350 of FIG. 3, a second etch process is then performed. The amorphized implanted regions 145 are etched during this second etch process to create recessed regions 142 in which the source contact 170 and the drain contact 180 will be formed. The second etch process may be a wet etch process, such as using aqueous potassium hydroxide.

Further, the shape of the etched region, or recessed regions 142 may be more rectangular as a result of the earlier implant process. For example, wet etch processes tend to be isotropic, which may adversely affect the shape of the recessed regions 142. However, by performing the implant process first, the amorphized implanted regions 145 may be created anisotropically. The amorphized implanted regions 145 are more quickly etched than the unimplanted regions of the barrier layer 140. In other words, the etch selectivity of the amorphized implanted regions 145 to the unimplanted regions of the barrier layer 140 may be very high, such as greater than 2. In certain embodiments, the etch selectivity may be 5 or more. Because of this, isotropic etching is reduced. Additionally, the depth of the recessed region 142 may be better controlled, as the etching of the amorphized implanted regions 145 occurs much more quickly than the etching of the rest of the barrier layer 140. In other words, the unimplanted portions of the barrier layer 140 may serve as an etch stop layer. Thus, in certain embodiments, the wet etch process may be terminated based on a predetermined duration of time.

In a different embodiment, a dry etch process may be used. For example, a halogen containing gas may be used to etch the amorphized implanted regions 145. The halogen containing gas may comprise fluorine or chlorine. The halogen reacts with the amorphized implanted regions 145 more readily than with the rest of the barrier layer 140. In other embodiments, a different etching species may be used. In certain embodiments, the dry etch process may be terminated based on a predetermined duration of time. In another embodiment, an optical emission spectroscopy (OES) system may be employed. For example, as long as the barrier layer 140 is being etched, the optical emission spectrograph will continue to show the presence of elements, such as aluminum, gallium and nitrogen. As the amorphized implanted regions become completely etched, the rate at which these elements are produced, decreases. This decrease in etch rate may be used to terminate the dry etch process.

In addition to OES systems, other metrology systems can be used. For example, absorption spectroscopy may be used to monitor the plasma. Alternatively, Fourier-transform infrared spectroscopy (FTIR), reflectometry or ellipsometry may be used to monitor the material being etched.

Additionally, it was been found that the selection of the implant energy and dose of the implant process affects the roughness of the recessed regions 142. For example, the roughness of the recessed regions 142 after a wet etch may be less than about 1.5 nm if xenon is implanted at an implant energy between 10 KeV and 25 KeV and a dose of between 2E15 and 3E16. The roughness of the recessed regions 142 may also be less than 1.0 nm for certain combinations of implant energy and dose. Additionally, for some combinations, the roughness of the recessed regions 142 may be less than 0.7 nm or 0.5 nm, depending on the selection of implant energy and dose.

Figure 2G:
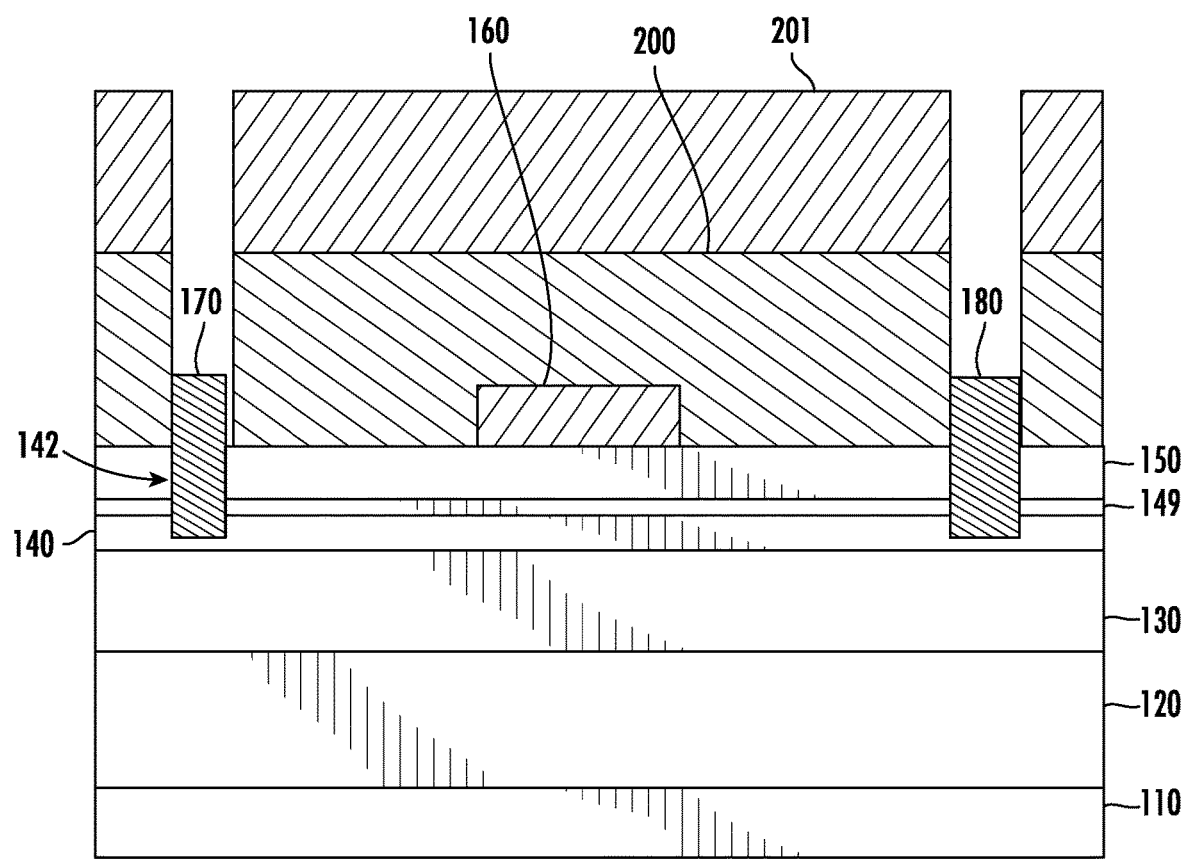

As shown in FIG. 2G and Box 360 of FIG. 3, the source contact 170 and the drain contact 180 may then be formed in the recessed regions 142. This may be performed using conventional methods. For example, a conductive material 201, such as a metal, may be disposed on the surface of the workpiece. The conductive material 201 fills the recessed regions 142 and rests on top of the patterned photoresist 200 in other areas. In this way, the conductive material is in contact with the barrier layer 140.

Figure 2H:
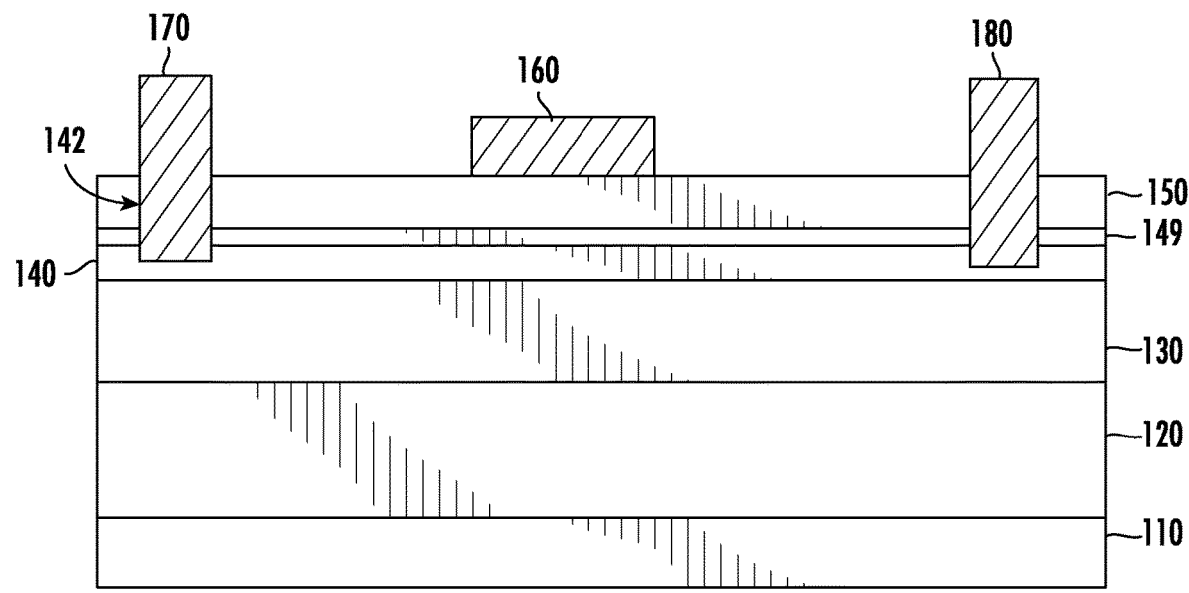

Finally, as shown in FIG. 2H and Box 370 of FIG. 3, the patterned photoresist 200 may be removed. Any conductive material 201 that is disposed on top of the patterned photoresist 200 is also removed by this process.

Additional processes not shown in FIG. 3 may include depositing additional dielectric layers, and forming field plates, vias and interconnections.

Of course, some of the fabrication processes may be performed in a different order. For example, a gate last process may be performed, where the gate structure 160 is not added until after the source contact 170 and the drain contact 180 have been formed.

In other embodiments, the recessed regions 142 may be formed prior to the application of the passivation layer 150. In this embodiment, Box 330 may be omitted.

Figure 4:
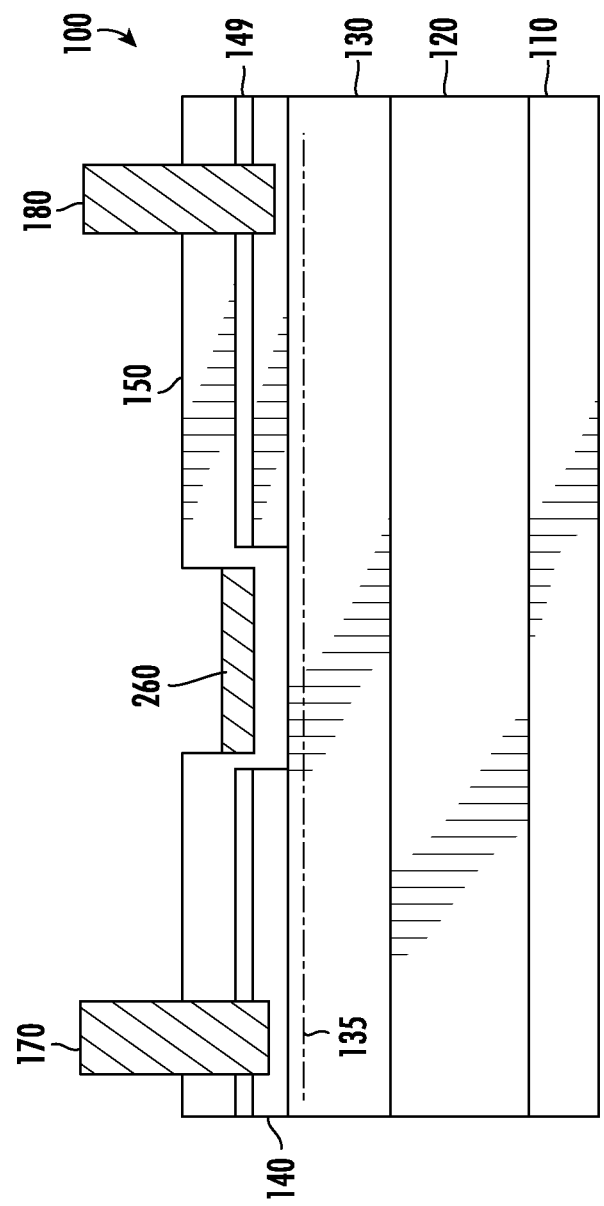
FIG. 4 shows a cross section of a HEMT with the source and drain contacts disposed in the etched recessed regions according to another embodiment.

Further, this process is also suitable for HEMT devices that include a recessed gate, such as that shown in FIG. 4. In FIG. 4, the gate 260 is recessed such that at least a portion of the barrier layer 140 does not extend under the gate 260. In certain embodiments, the entire barrier layer 140 is absent under the gate 260. In other embodiments, known as shallow recessed gates, the thickness of the barrier layer 140 is reduced under the gate 260. Further, in other embodiments, known as deep recessed gates, a portion of the channel layer 130 may be absent under the gate 260. In all of these embodiments, while the gate may be created differently than described above, the formation of the recessed regions 142 is the same as described above. The gate may be formed either before the source contact 170 and the drain contact 180, as shown in FIG. 3. Alternatively, the gate 260 may be formed using a gate last process, where the gate 260 is formed after the source contact 170 and the drain contact 180 have been formed.

Further, while FIG. 2A-2H and FIG. 3 show the process of creating recessed regions 142 for the source contact 170 and drain contact 180 during the fabrication of a HEMT, the disclosure is not limited to this embodiment. Specifically, the method may be used to perform an implant process to amorphize a layer of a workpiece in preparation for a subsequent etch process. For example, there may be other instances where a recessed region of a certain depth may be created in a barrier layer 140 of a HEMT.

To create this recessed region in the barrier layer 140, Boxes 320, 340 and 350 of FIG. 350 may be performed. In embodiments where a passivation layer 150 has already been applied, Box 330 may also be performed.

The system described herein has many advantages. As noted above, the contact resistance of a HEMT may be greater than 1.5 ohm-mm if the source contact 170 and drain contacts 180 are formed on top of the barrier layer 140. By etching a portion of the barrier layer 140 to form recessed regions 142, the contact resistance of the HEMT may be reduced. Further, the use of one or more implant processes allows more precise control over the depth of the recessed regions 142. As noted above, the depth of the recessed regions 142 may be between 25% and 90% of the thickness of the barrier layer 140. Of course, the depth may be a different percentage of the thickness of the barrier layer 140. Etching only a portion of the barrier layer 140 may be difficult as there is no etch stop layer. Ion implantation allows a precise technique to create amorphized implanted regions 145 of a specified depth. Thus, the etch stop may be the transition between the amorphized implanted regions 145 and the remainder of the barrier layer 140. Additionally, the use of ion implantation allows more regular shaped recessed regions 142. For example, using a wet etch process without a previous implant creates a recessed region 142 where the bottom surface is not flat. In fact, wet etch typically creates a bottom surface that is somewhat bowed downward. This issue is eliminated by the use of an amorphizing ion implantation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of fabricating a high electron mobility transistor, comprising:

applying a patterned photoresist mask on top of a workpiece, wherein the workpiece comprises a substrate, a buffer layer disposed above the substrate, a channel layer disposed above the buffer layer, a barrier layer disposed above the channel layer, and a passivation layer disposed above the barrier layer, wherein the patterned photoresist mask is applied on the passivation surface and wherein exposed portions of the passivation layer are not covered by the patterned photoresist mask;

performing a first etch process to etch the exposed portions of the passivation layer until the barrier layer is reached;

implanting ions into exposed portions of the barrier layer to create amorphized implanted regions of the barrier layer;

performing a second etch process to etch the amorphized implanted regions to form recessed regions;

forming a source contact and a drain contact in the recessed regions by disposing a conductive material on top of the workpiece while the patterned photoresist mask is in place; and removing the patterned photoresist mask and conductive material disposed on top of the patterned photoresist mask,
wherein the patterned photoresist mask serves as a mask for first etch process, the second etch process and an implant process.

2. The method of claim 1, wherein the ions comprise molecules comprising a Group 4 or inert element.

3. The method of claim 2, wherein the ions comprise an inert element.

4. The method of claim 1, wherein the barrier layer comprises a III-V semiconductor.

5. The method of claim 1, wherein the second etch process is performed using a wet etch process.

6. The method of claim 1, wherein the second etch process is performed using a dry etch process.

7. The method of claim 1, wherein the implanting is performed at a temperature less than −50° C.

8. The method of claim 1, wherein the implanting is performed using a plurality of implant energies.

9. The method of claim 1, wherein a cap layer is disposed between the barrier layer and the passivation layer, and the cap layer is etched by the first etch process.

10. The method of claim 1, further comprising forming a gate structure, wherein the gate structure is disposed on the passivation layer or in a recessed portion of the passivation layer.

11. The method of claim 1, wherein the recessed regions do not extend through an entirety of the barrier layer.

12. The method of claim 1, wherein a roughness of the recessed regions is less than 1 nm.

13. The method of claim 10, wherein the gate structure is formed prior to applying the patterned photoresist mask, such that the patterned photoresist mask is applied on top of the gate structure.

14. The method of claim 10, wherein the gate structure is formed after the source contact and drain contact are formed.

* * * * *